United States Patent
Carlach et al.

(10) Patent No.: US 9,397,700 B2
(45) Date of Patent: Jul. 19, 2016

(54) ERROR CORRECTOR CODING AND DECODING

(71) Applicant: Orange, Paris (FR)

(72) Inventors: Jean-Claude Carlach, Rennes (FR); Brahim Oueslati, Ville Saint-Laurent (CA)

(73) Assignee: ORANGE, Paris (FR)

( * ) Notice: Subject to any disclaimer, the term of this patent is extended or adjusted under 35 U.S.C. 154(b) by 73 days.

(21) Appl. No.: 14/350,527

(22) PCT Filed: Oct. 11, 2012

(86) PCT No.: PCT/FR2012/052320
§ 371 (c)(1),
(2) Date: Apr. 8, 2014

(87) PCT Pub. No.: WO2013/054054
PCT Pub. Date: Apr. 18, 2013

(65) Prior Publication Data
US 2014/0281792 A1    Sep. 18, 2014

(30) Foreign Application Priority Data
Oct. 14, 2011    (FR) ..................................... 11 59323

(51) Int. Cl.
*H03M 13/11*    (2006.01)
*H03M 13/00*    (2006.01)
*H03M 13/29*    (2006.01)

(52) U.S. Cl.
CPC ........ *H03M 13/118* (2013.01); *H03M 13/1125* (2013.01); *H03M 13/1137* (2013.01); *H03M 13/1174* (2013.01); *H03M 13/1191* (2013.01); *H03M 13/2906* (2013.01); *H03M 13/611* (2013.01); *H03M 13/613* (2013.01)

(58) Field of Classification Search
CPC .......... H03M 13/118; H03M 13/1174; H03M 13/613
See application file for complete search history.

(56) References Cited

PUBLICATIONS

Mayur Punekar, Mark F. Flanagan, Low Complexity Linear Programming Decoding of Nonbinary Linear Codes, Proceedings of the Forty-Eighth Annual Allerton Conference on Communication, Control, and Computing, Sep. 29-Oct. 1, 2010.*

Xuye Wang; Piming Ma, "Infeasible primal-dual interior-point algorithm for linear-programming decoding of LDPC codes," in Communication Technology (ICCT), 2011 IEEE 13th International Conference on , vol., No., pp. 109-113, Sep. 25-28, 2011.*

International Search Report and Written Opinion dated Jan. 7, 2013 for corresponding International Application No. PCT/FR2012/052320, filed Oct. 11, 2012.

French Search Report and Written Opinion dated Mar. 22, 2012 for corresponding French Application No. 1159323, filed Oct. 14, 2011.

(Continued)

*Primary Examiner* — Joseph D Torres
(74) *Attorney, Agent, or Firm* — David D. Brush; Westman, Champlin & Koehler, P.A.

(57) ABSTRACT

Methods and devices are provided for coding and decoding coded data including source data and redundancy data. The redundancy data is obtained by applying, upon coding, an error correction code to the source data, implementing a generating matrix. The generating matrix includes, in its systematic form, an identity matrix and an invertible matrix for switching from the source data to the redundancy data. The coding or decoding is based on a Tanner graph, which combines the graph of the error corrector code and the graph of the dual code of the error correction code by superimposing these graphs.

9 Claims, 3 Drawing Sheets

(56) References Cited

PUBLICATIONS

International Preliminary Report on Patentability and English translation of the Written Opinion dated Apr. 15, 2014 for corresponding International Application No. PCT/FR2012/052320, filed Oct. 11, 2012.

Hehn et al., "Multiple-Bases Belief-Propagation Decoding of High-Density Cyclic Codes", IEEE Transactions on Communications, vol. 58, No. 1, Jan. 1, 2010, XP011300484.

Adde et al., "Near Maximum Likelihood Soft-Decision Decoding of a Particular Class of Rate-1/2 Systematic Linear Block Codes", Electronics Letters, vol. 47, No. 4, Feb. 17, 2011, XP006038052.

Pless et al., "Handbook of Coding Theory", vol. 1, Chapter 3, 1998, pp. 177 and 199.

Robert Michael Tanner, Minimum-Distance Bounds by Graph Analysis, IEEE Transactions on Information Theory, Feb. 2001, p. 808-821, vol. 47, No. 2.

\* cited by examiner

ERROR CORRECTOR CODING AND DECODING

1. CROSS-REFERENCE TO RELATES APPLICATIONS

This application is a Section 371 National Stage Application of International Application No. PCT/FR2012/052320, filed Oct. 11, 2012, which is incorporated by reference in its entirety and published as WO 2013/054054 on Apr. 18, 2013, not in English.

2. FIELD OF THE INVENTION

The field of the invention is that of the encoding and decoding of data, using an error-correcting code.

More specifically, the invention pertains to a novel technique for encoding source data, delivering packets of encoded data or a stream of encoded data comprising the source data and redundancy data intended for transmission on a transmission channel (for example of a radio, optical or electrical type) or for storage in a hardware medium. The invention also pertains to a corresponding technique for decoding that makes it possible especially to correct the transmission errors inherent in the transmission channel.

The invention can be applied especially in the following fields:
- the transmission of information by electrical wire telecommunications, such as communications using ADSL standards, or optical telecommunications, by fiber optics or free-space optics;
- the transmission of information in spatial and terrestrial wireless radio communications such as TNT digital television systems, DAB digital radio systems, GSM or UMTS telephony, WiFi radio networks and also future communications systems such as future DVB, 4G, LTE standards, future Internet or the transmission of information between vehicles, objects and communicating machines, etc;
- the compression and decompression of information sources;
- the generation and detection of sequences called scrambling sequences in CDMA systems;
- the storage of information in magnetic, optical, mechanical or electrical mass memories to constitute hard disk drives or computer random access memories or USB type interface memory sticks, etc;
- the correction of information during computation in an integrated circuit of a microprocessor or in a computer;
- robotics controlled by an artificial intelligence based on neural networks; etc.

3. PRIOR ART

Many encoding techniques are used for correcting transmission errors when decoding, by generating redundancy data from source data.

Thus, an error-correcting code is classically defined by:
- a length n, corresponding to the data at output of the encoder (code word with a length n formed by k source data and (n−k) redundancy data);
- a number of payload information bits or symbols k, corresponding to the data at input of the encoder, also called source data; and
- a minimum distance $d_{min}$.

The minimum distance of a code $d_{min}$ corresponds to the minimum distance between two code words. It makes it possible to determine the maximum number of errors that the code can correct in a code word.

Thus, the greater the minimum distance $d_{min}$ the better is the error-correcting code since it enables the detection of $(d_{min}-1)$ erroneous symbols and the correction of $\lfloor (d_{min}-1)/2 \rfloor$ (where the operator $\lfloor . \rfloor$ designates the integer part).

Among the encoding techniques enabling the correction of transmission errors, turbo-codes and LDPC (low density parity check) codes have high performance in terms of error correction on codes of great length n, with n being of the order of at least some thousands of bits (n>1000).

By contrast, the turbo-codes and the LDPC codes have lower performance for shorter codes n (n<1000).

This is partly due to the fact that the belief propagation algorithm used at decoding or the variants of this algorithm become sub-optimal as and when the minimum length of the cycle diminishes. It may be recalled that a cycle corresponds to a closed path in a Tanner graph representing the constraints that the symbols of a word must meet with in order to constitute a word of the code. The notion of a Tanner graph is well known and described especially in the article by R. M. Tanner, "*Minimum-distance bounds by graph analysis*", IEEE Transactions on information theory, Vol. 47, February 2001.

A belief propagation algorithm of this kind is therefore not efficient for codes having very dense generating matrices (i.e. having many bits at 1) and therefore for codes having excellent relative minimum Hamming distances $\delta = d_{min}/n$.

Besides, the rigorously optimal exhaustive decoding algorithm is difficult to obtain because it has an exponential complexity in $O(2^k)$, where k is the dimension of the code, and is therefore very costly. Furthermore, it does not enable the real-time encoding of small-length codes.

Furthermore, for industrial-scale use, the optimizing of the error-correcting codes includes the minimizing of the complexities of encoding and decoding in terms of costs of hardware and energy consumed. Now, these problems of optimizing the decoding of the error-correcting codes are even more difficult to resolve when the lengths of the codes are small to average, i.e. of the order of n<1000.

There is therefore a need for a novel technique for decoding efficient error-correcting codes, namely error-correcting codes having a minimum distance $d_{min}$ that is as great as possible and especially having very short cycles.

4. SUMMARY OF THE INVENTION

An exemplary embodiment of the invention proposes a method for decoding encoded data, comprising source data and redundancy data. These redundancy data are obtained by the application, when encoding, of an error-correcting code to the source data, implementing a generating matrix comprising, in its systematic form, an identity matrix and an invertible matrix for switching from the source data to the redundancy data.

According to the invention, the method comprises a step for decoding that simultaneously implements the error-correcting code, called a primal error-correcting code, and a code that is the dual of the primal error-correcting code, called a dual error correcting code.

According to the invention, the method comprises a step for decoding data encoded by means of an error-correcting code using at the same time the error-correcting code in its primal form and in its dual form.

In particular, the combined use of the error-correcting code in its two primal and dual forms reduces the number of iterations implemented at decoding, especially for a belief propagation type of algorithm and therefore for the real-time decoding of the small-length codes (n<1000).

According to the invention, the matrix P fro switching from source data to redundancy data is considered to b reversible. No other constraint is imposed on the error-correcting code and especially on the length of this code or the length of the cycles. The error-correcting code implemented can therefore be considered to be quasi-random.

The invention thus offers a decoding algorithm that is simpler and more efficient than those of the prior-art techniques, especially for codes having small lengths and/or short cycles.

According to one particular embodiment, the decoding step implements a modified Tanner graph, called as a primal-dual graph, obtained by superimposing a Tanner graph corresponding to the primal error-correcting code, called a primal graph, and a Tanner graph corresponding to the dual error-correcting code, called a dual graph, the superimposition consisting of the two-by-two connection of the input variables of the primal graph with the input variables of the dual graph corresponding to the same source data and of the two-by-two connection of the output variables of the primal graph with the output variables of the dual graph corresponding to the same redundancy data.

In this way, each input or output variable of the primal-dual graph is connected to a pair of constraints comprising an equality type constraint and a modulo-2 addition type constraint defining an elementary tree. In other words, the decoding structure proposed enables the isolation of small elementary trees, each corresponding to a piece of source data or to a piece of redundancy data.

Owing to this elementary tree structure, the primal-dual graph obtained does not have any loop structure, loops being classically considered to be a source of deterioration in the decoding. In other words, there is only one path from a root to a leaf of the tree, hence only one way of propagating information in the primal-dual graph. This structure therefore reduces the effects of the cycles, which pose a problem in the prior art, by making optimal use of the available information. In other words, the simultaneous treatment of the input/output variables in the primal-dual graph compensates for the computations made to propagate the variables and therefore reduces the influence of the cycles on the decoding algorithm.

Furthermore, the propagation of the internal variables is modified as compared with the classic "belief propagation" type algorithm and enables a decoding of the small-length codes that is made easier. This elementary tree structure makes it possible to obtain an average of the a priori propagation of source data in each tree.

Finally, the presence of as many pairs of constraints (or elementary trees) as there are encoded data (source data and redundancy data) dictates the use of all the available data, thus increasing the decoding performance. The information available on the input and output variables of the primal-dual graph is also twice as much as that available of the prior-art techniques.

The superimposition of the graphs of the primal code and of the dual code therefore improves the decoding performance as compared with current techniques by providing especially faster convergence of the decoding algorithm towards a code word that is closest to the received word. It also compensates for the non-linearity related to constraints (equality, modulo-2 addition).

In particular, since each input or output variable of the primal-dual graph is connected to a pair of constraints comprising an equality type constraint and a modulo-2 addition type constraint, the decoding method according to the invention comprises a step for determining at least one internal variable of the primal-dual graph carrying out the following:

for a modulo-2 addition type of constraint:
  a step of transformation, from the real domain to the complex domain, of the variables connected to the modulo-2 addition type constraint;
  a step of addition in the complex domain;
  a step of transformation, from the complex domain to the real domain, of the result of the addition step;
for an equality type constraint:
  a step of addition in the real domain.

In this way, the operations performed to propagate the variables related to an equality type or modulo-2 addition type constraint are simplified, by using addition type operators in the complex domain or in the real domain.

In particular, the steps of transformation (from the real domain to the complex domain or from the complex domain to the real domain) apply a non-linear function NL such that:

$$\begin{cases} NL[x] = \log\left[\dfrac{1-\exp[x]}{1+\exp[x]}\right] & \text{if } x \neq 0 \\ NL[x] = 0 & \text{if } x = 0 \end{cases}$$

It can be noted that this non-linear function is equal to its own inverse: $NL[x]=NL^{-1}[x]$.

The application of such a non-linear function makes it possible to obtain the equivalent of the a posteriori computation of the probabilities at output of a modulo-2 addition (exclusive-or operation) type of constraint by means of a simple addition in the field of the real values and a multiplication of the signs. In this way, the operating complexity of the decoding is reduced.

According to one particular embodiment, since each input or output variable of the primal-dual graph is connected to a pair of constraints comprising an equality type constraint and a modulo-2 addition type constraint, the decoding method implements at least one decoding iteration, comprising:
  a forward propagation phase consisting of the propagation of the internal variables of the primal-dual graph which are connected to an equality type constraint, to update the internal variables of the primal-dual graph which are connected to a modulo-2 addition type constraint, and
  a backwardward propagation phase consisting of the propagation of the internal variables of the primal-dual graph which are connected to a modulo-2 addition type constraint, to update the internal variables of the primal-dual graph which are connected to an equality type constraint.

In other words, a decoding iteration comprises a first phase of propagation of the source data in all the elementary trees and then a second phase of propagation of the redundancy data in all the elementary trees, one phase transmitting to the other the values obtained at the output of each elementary tree.

The operators associated with each pair of constraints therefore work simultaneously.

In particular, the forward propagation phase implements the following sub-steps for each pair of constraints connected to an input or output variable of the primal-dual graph:
  determining a forward likelihood value $v_0^F(t)$ assigned to the input or output variable of the primal-dual graph, implementing an addition in the real domain, such that:

$$v_0^F(t) = \frac{\sum_{i=1}^{d} v_i(t)}{d},$$

determining likelihood values assigned to the variables connected to the modulo-2 addition type of constraint after transformation from the real domain to the complex domain, called transformed forward likelihood values, such that:
the input or output variable of the primal-dual graph after transformation is expressed in the form: $w_0^F(t) = NL[v_0(0)+v_0^F(t)]$ and $s_0^F(t)=\text{sign}[v_0(0)+v_0^F(t)]$;
the internal variables after transformation are expressed in the form: $w_l^F(t)=NL[v'_l(t)]$ and $s_l^F(t)=\text{sign}[v'_l(t)]$ for $l \in \{1, \ldots, d\}$;
updating the transformed forward likelihood values, implementing an addition in the complex domain, such that:

$$w_l^F(t+1) = w_0^F(t) + \frac{\sum_{i=1,i \neq l}^{d} w_i^F(t)}{d-1} \text{ and}$$

$$s_l^F(t+1) = \prod_{i=0, i \neq l}^{d} s_i^F(t)$$

updating the values of the internal variables connected to the modulo-2 addition type constraint implementing a transformation from the complex domain to the real domain of the updated transformed forward likelihood values such that:

$v'_l(t+1)=s_l^F(t+1)NL[w_l^F(t+1)]$;

with:
$v_0(0)$ being an initial value assigned to the input or output variable of the primal-dual graph;
$v_i(t)$ being the internal variables connected to the equality type constraint;
$v'_l(t)$ being the internal variables connected to the modulo-2 addition type constraint;
d being the degree of constraints associated with a constraint of the primal-dual graph;
$i \in \{1, \ldots, d\} l \in \{1, \ldots, d\}$;
NL[x] being a non-linear function such that:

$$\begin{cases} NL[x] = \log\left[\frac{1-\exp[x]}{1+\exp[x]}\right] & \text{if } x \neq 0 \\ NL[x] = 0 & \text{if } x = 0 \end{cases}.$$

The backward propagation phase for its part implements the following sub-steps, for each pair of constraints connected to an input or output variable of the primal-dual graph:
determining likelihood values assigned to the variables connected to the modulo-2 addition type constraint after transformation from the real domain to the complex domain, called transformed backward likelihood values, such that:
the internal variables after transformation are expressed in the form:

$w_l^B(t)=NL[v'_l(t)]$ and $s_l^B(t)=\text{sign}[v'_l(t)]$, for $l \in \{1, \ldots, d\}$;

the input or output variable of the primal-dual graph after transformation is expressed in the form:

$$w_0^B(t) = \frac{\sum_{l=1}^{d} w_l^B(t)}{d} \text{ and}$$

$$s_0^B(t) = \left(\prod_{l=1}^{d} s_l^B(t)\right);$$

determining a backward likelihood value $v_0^B(t)$ assigned to the input or output variable of the primal-dual graph, implementing a transformation from the complex domain to the real domain of the input or output variable after transformation such that:

$v_0^B(t)=s_0^{B(t)} \times NL[w_0^B(t)]$ updating the values of the internal variables connected to the equality type constraint implementing an addition in the real domain, such that:

$$v_l(t+1) = v_0(0) + v_0^B(t) + \frac{\sum_{i=1,i \neq l}^{d} v_i(t)}{d-1},$$

updating the input or output variable of the primal-dual graph such that:

$v_0(t+1)=v_0^F(t)+v_0(0)+v_0^B(t)$.

According to one particular characteristic of the invention the decoding method comprises a preliminary step for initializing the input variables, the output variables and the internal variables of the primal-dual graph at zero.

The implementing of these two forward and backward propagation phases according to the invention, as well as the initializing of the set of variables, gives a very fast convergence of the decoding algorithm towards the code word closest to the received word.

According to another aspect of the invention, at least two input or output variables of the primal-dual graph are connected to a same pair of constraints comprising an equality type constraint and a modulo-2 addition type constraint.

It is thus possible to multiplex the operators used to propagate the variables connected to an equality type constraint or modulo-2 addition type constraint and thus reduce the quantity of hardware resources needed.

According to one particular embodiment of the invention, the primal error-correcting code has a rate of ½. In other words, this is a quasi-random code with parameters (n=2k,k, $d_{min}$). In this case, we obtain a structure symmetrical with the primal-dual graph enabling the simple and optimal decoding of such a code with a rate of ½.

Naturally, it is also possible to decode the error-correcting codes having a rate different from ½.

Thus, to decode an error-correcting code having a rate greater than ½, it is possible to add an equality constraint (and a modulo-2 addition constraint respectively) at output of two equality constraints (respectively two modulo-2 addition constraints) connected to two (or more) redundancy data in the primal-dual graph.

In order to decode error-correcting codes having a rate lower than ½, it is possible to add an equality constraint (and a modulo-2 addition constraint respectively) at output of two equality constraints (two modulo-2 addition constraints respectively) connected to two (or more) source data in the primal-dual graph.

In another embodiment, the invention pertains to a corresponding device for the decoding of encoded data.

According to the invention, such a device comprises a decoding module simultaneously implementing the error-correcting code, called a primal error-correcting code, and a code that is the dual of the primal error-correcting code, called a dual error-correcting code.

Such a decoding device is especially suited to implementing the decoding method described here above.

Such a decoder could of course comprise the different characteristics pertaining to the decoding method of the invention which can be combined or taken separately. Thus, the characteristics and advantages of the decoder are the same as those of the decoding method and are not described in more ample detail.

It can be noted that such a decoder can be implemented in the form of an integrated circuit, or in a microprocessor type electronic component. Thus, the decoding algorithm according to the invention can be implemented in various ways, especially in a hardware form or in software form.

In particular, it is possible to use the decoder as described here above either to decode encoded data or to encode source data. In the latter case, the redundancy data can be forced to zero in order to enable the use of the decoder as an encoder.

The invention also pertains to a method for encoding source data delivering encoded data comprising source data and redundancy data.

According to the invention, such an encoding method comprises an encoding step that simultaneously implements:
  an error-correcting code, called a primal error-correcting code, implementing a generating matrix comprising, in its systematic form, an identity matrix and an invertible matrix P for switching from the source data to the redundancy data, and
  a code that is the dual of the primal error-correcting code, called a dual error-correcting code.

The invention thus proposes a novel technique for the encoding of source data by means of an error-correcting code that uses, at the same time, the error-correcting code in its primal form and in its dual form.

It is thus possible to simply obtain novel codes or to rebuild existing codes having any unspecified length, easily decodable by the decoding method according to the invention.

Such an encoding method could of course comprise the different characteristics of the decoding method according to the invention.

In another embodiment, the invention pertains to a corresponding encoding device. Such a device comprises an encoding module that simultaneously implements:
  an error-correcting code, called a primal error-correcting code, implementing a generating matrix comprising, in its systematic form, an identity matrix and an invertible matrix P for switching from the source data to the redundancy data, and
  a code that is the dual of the primal error-correcting code, called a dual error-correcting code.

Such an encoding device is especially adapted to implementing the encoding method described here above.

Again, such an encoder can be implemented in the form of an integrated circuit or a microprocessor-type electronic component. Thus, the encoding algorithm according to the invention can be implemented in various ways, especially in hardware form or in software form.

The invention also pertains to a device for the encoding and decoding of data, comprising an encoding and decoding module simultaneously implementing:
  an error-correcting code, called a primal error-correcting code, implementing a generating matrix comprising, in its systematic form, an identity matrix and an invertible matrix P for switching from the source data to the redundancy data, and
  a code that is the dual of the primal error-correcting code, called a dual error-correcting code.

Such a device, also called a codec for "coder/decoder" or encoder/decoder, can be implemented in the form of an integrated circuit, or in a microprocessor-type electronic component. In particular, the use of a codec enables the pooling of the hardware resources used for encoding and decoding. For example, such a codec can receive source data at input and deliver encoded data at output or receive encoded data at input and deliver an estimation of the source data at output.

In yet another embodiment, the invention concerns one or more computer programs comprising instructions for implementing a method for decoding or a method for encoding as described here above when the program or programs are executed by a processor. Such programs can be stored in an information medium.

5. LIST OF FIGURES

Other features and advantages of the invention shall appear more clearly from the following description of a particular embodiment, given by way of a simple, illustrative and non-exhaustive example, and from the appended figures, of which:

FIG. 1 shows the main steps implemented by an encoder/decoder according to the invention;

FIGS. 2A, 2B and 2C respectively illustrate a Tanner graph of an (8, 4, 4) Hamming code having an invertible switching matrix P, a Tanner graph of the code that is the dual of the (8, 4, 4) Hamming code and a corresponding primal-dual graph according to the invention;

FIGS. 3A, 3B and 3C respectively illustrate a Tanner graph of a (12, 6) code having an invertible switching matrix P, a Tanner graph of the code that is dual of this (12, 6) code and a corresponding primal-dual graph according to the invention;

Figure 6A:
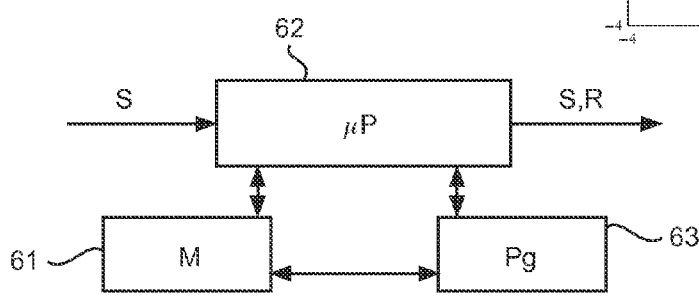
Figure 6B:
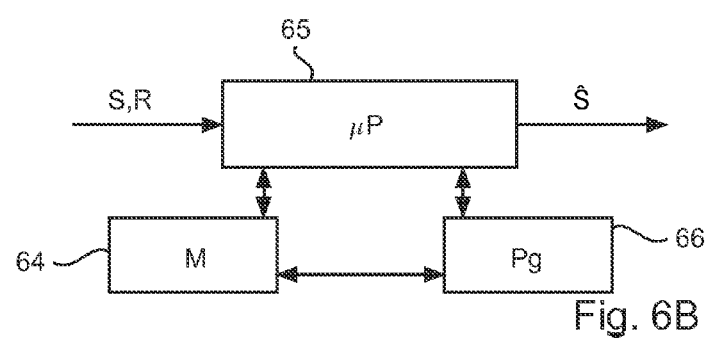

FIGS. 6A and 6B present the simplified structures of an encoder and a decoder according to one particular embodiment of the invention.

6. DESCRIPTION OF ONE EMBODIMENT OF THE INVENTION

6.1 General Principle

The general principle of the invention relies on the simultaneous use of an error-correcting code, called a primal code, and the dual of this error-correcting code, called a dual code, to encode or decode data.

Here, we consider a general definition of duality, also called iso-duality, as expressed especially in V. S. Pless and W. C. Huffman, "*Handbook of coding theory*", Volume I, Chapter 3, pages 177 to 199. This definition lays down no constraints of orthogonality between the vectors of the primal code and those of the dual code. The only constraint is that the matrix for switching from the source data to the redundancy data is invertible.

The invention offers especially a solution to the problem of soft decision decoding of the error-correcting block codes of a length n containing k source data (also called symbols or information bits). In particular, it proposes a novel technique for the optimal decoding of error-correcting codes having great minimal distances for these parameters n and k.

For example, the invention offers a decoding technique offering better performance than the techniques of the prior art relative to efficient error-correcting codes such as: the classic algebraic codes such as the (24, 12, 8) Golay code, the (48, 24, 12) code, the Reed-Müller (RM) codes; the turbo-codes; the LDPC codes, etc.

Figure 1:
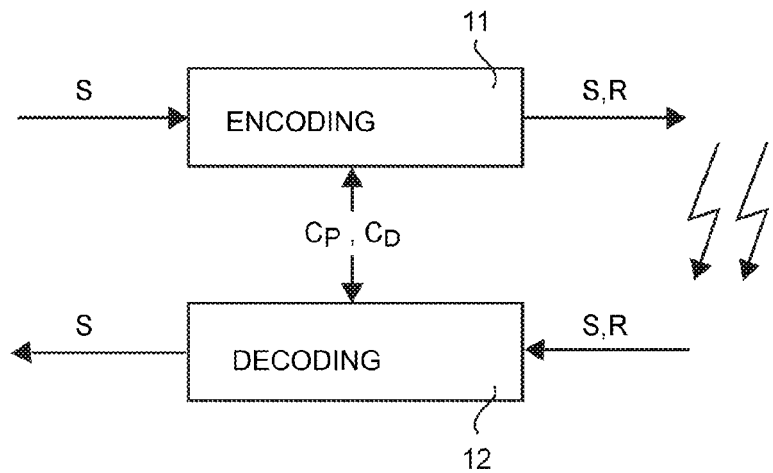

Referring now to FIG. 1, we present the main steps implemented by a binary encoder and/or decoder according to the invention. This is a simple example in which the invention is used both for the encoding and for the decoding of data. Naturally, it is possible to use the encoding algorithm proposed with a classic decoding algorithm or to use the decoding algorithm proposed with a classic encoding algorithm. In the latter case, the only constraint dictated on the encoder is that the matrix fro switching from the source data to the redundancy data should be invertible.

Thus, according to the embodiment illustrated in FIG. 1, an encoder according to the invention inputs source data S in the form of packets or of a continuous stream, and outputs encoded data comprising the source data S and the redundancy data R. These encoded data can be conveyed by a transmission channel or stored on a medium, and then decoded by a decoder according to the invention.

Such a decoder inputs encoded data comprising the source data S and redundancy data R possibly erroneous, and delivers an estimation of the source data $\hat{S}$.

More specifically, the encoder implements an encoding step 11 simultaneously implementing:
- an error-correcting code, called a primal error-correcting code $C_P$, implementing a generating matrix comprising, in its systematic form, an identity matrix and an invertible matrix P for switching from source data to redundancy data, and
- a code that is the dual of the primal error-correcting code, called a dual error-correcting code $C_D$.

In the same way, the decoder implements a step for decoding 12 simultaneously implementing the primal error-correcting code $C_P$ and the dual error-correcting code $C_D$.

It can be noted that the encoding step 11 and the decoding step 12 both use the primal error-correcting code $C_P$ and the dual error-correcting code $C_D$. The encoder and the decoder can therefore share resources, thus reducing the complexities of encoding and decoding in terms of costs of hardware and energy consumed.

6.2 Primal-Dual Tanner Graph

According to the invention, the encoding step 11 and/or the decoding step 12 implement a modified Tanner graph, called a primal-dual graph, obtained by superimposing a Tanner graph corresponding to the primal code $C_P$, called a primal graph, and a Tanner graph corresponding to the dual code $C_D$, called a dual graph.

The Tanner graph corresponding to the dual code according to the invention can be obtained in different ways.

In a first example, the dual Tanner graph is built from the primal Tanner graph in replacing the equality type constraints by modulo-2 addition type constraints and the modulo-2 addition type constraints by equality type constraints.

In a second example, the dual Tanner graph is directly built from the inverse of the matrix for switching from the source data to the redundancy data (denoted as $P^{-1}$). This inverse matrix makes it possible indeed to express the source data from the redundancy data.

Here below we describe two examples of the building of such primal-dual graphs for an extended (8, 4, 4) Hamming code and for a (12, 6) code having a matrix P for switching from the source data to the redundancy data which is invertible. These two codes have rates of 12, but as already indicated, it is also possible to decode codes with rates greater than 12 or lower than ½ respectively by:
- adding an equality constraint (and a modulo-2 addition constraint respectively) at output of two equality constraints (and two modulo-2 addition constraints respectively) connected to two (or more) redundancy data in the primal-dual graph, which amounts to considering a quasi-random initial error-correcting code with a switching matrix P which is invertible and adding columns to the switching matrix P;
- adding an equality constraint (and a modulo-2 addition constraint respectively) at output of two equality constraints (and two modulo-2 addition constraints respectively) connected to two (or more) source data in the primal-dual graph, which amounts to considering a quasi-random initial error-correcting code with a switching matrix P which is invertible and adding rows to the switching matrix P.

Naturally, the invention can be used to decode other codes such as the Golay code, the Reed-Müller code, the turbo-codes, LDPC codes, etc.

A) First Example

Extended (8, 4, 4) Hamming Code

Here below, we present the building of a primal-dual graph obtained from the primal and dual graphs of the extended Hamming code (n=8, k=4, $d_{min}$=4).

Such a code implements a generator matrix G comprising, in its systematic form, an identity matrix and a matrix P for switching from the source data to the redundancy data which is invertible such as for example:

$$G = [Id \mid P] = \begin{bmatrix} 1 & 0 & 0 & 0 & | & 0 & 1 & 1 & 1 \\ 0 & 1 & 0 & 0 & | & 1 & 0 & 1 & 1 \\ 0 & 0 & 1 & 0 & | & 1 & 1 & 0 & 1 \\ 0 & 0 & 0 & 1 & | & 1 & 1 & 1 & 0 \end{bmatrix}$$

This is a particular case, according to which the switching matrix P is equal to its transpose $P=P^{tr}$, and therefore $PP^{tr}=Id$, whence the switching matrix P is equal to its own inverse $P^{-1}=P^{tr}$. The (8, 4, 4) Hamming code in this example is therefore self-dual.

This example considers source data taking the form of four information bits denoted as $(x_0, x_1, x_2, x_3)$, and redundancy data taking the form of four redundancy bits denoted as $(r_0, r_1, r_2, r_3)$.

Figure 2A:
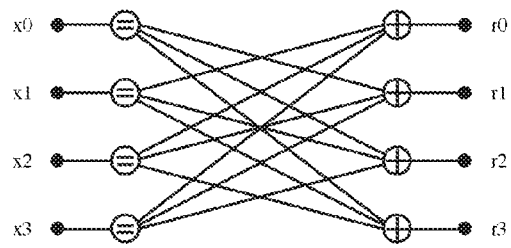

Classically, the algebraic relationships for computing redundancy bits from the information bits can be represented by a Tanner graph corresponding to the primal (8, 4, 4) Hamming code as illustrated in FIG. 2A.

Such a graph, called a primal graph, comprises input variables corresponding to the information bits and output variables corresponding to the redundancy bits, the redundancy bits being related to the information bits by means of constraints and permutations.

These constraints can be of two types:
the equality type constraints represented by the sign "=", corresponding to a repetition of the variable connected to this constraint;
the modulo-2 addition type constraints represented by the sign "+", corresponding to an "exclusive-or" type logic constraint.

In other words, these constraints and permutations enable the representation of the following algebraic relationships:

$r_0 = x_1 + x_2 + x_3;$ $r_1 = x_0 + x_2 + x_3;$ $r_2 = x_0 + x_1 + x_3$ and $r_3 = x_0 + x_1 + x_2.$ Since the (8, 4, 4) Hamming code is self-dual, its switching matrix P is equal to its own inverse, and it is enough to replace the equality type constraints by modulo-2 addition type constraints and the modulo-2 addition type constraints by equality type constraints to obtain the Tanner graph corresponding to the dual code of the (8, 4, 4) Hamming code. The permutations implemented are therefore identical between the two primal and dual graphs. For the hardware resources, the two identical interleavers are therefore used according to this example.

Figure 2B:
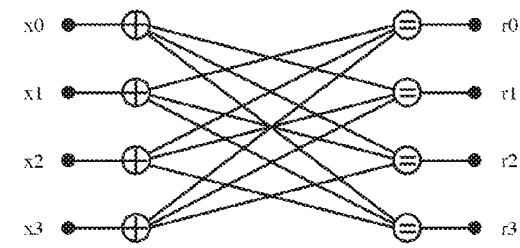

FIG. 2B thus illustrates the dual graph obtained, comprising input variables, corresponding to the information bits, and output variables, corresponding to the redundancy bits.

According to the invention, the modified Tanner graph, called a primal-dual graph, is defined. This graph makes it possible to take account simultaneously of the primal code and of the dual code.

Figure 2C:
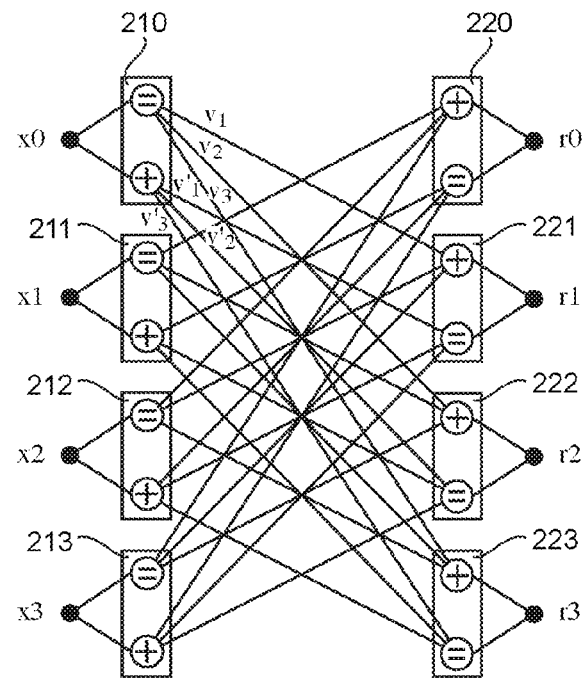

To this end, the primal graph illustrated in FIG. 2A and dual graph illustrated in FIG. 2B are superimposed to obtain a primal-dual graph illustrated in FIG. 2C.

This superimposition consists of the connection two-by-two of the input variables of the primal graph $(x_0, x_1, x_2, x_3)$ with the input variables of the dual graph $(x_0, x_1, x_2, x_3)$ corresponding to the same source data and the connection two-by-two of the output variables $(r_0, r_1, r_2, r_3)$ of the primal graph with the output variables $(r_0, r_1, r_2, r_3)$ of the dual graph corresponding to the same redundancy data.

In other words, the information bits $x_i$ of the primal graph are connected with the information bits $x_i$ of the dual graph for i as an integer ranging from 0 to 3 and the redundancy bits $r_i$ of the primal graph are connected with the redundancy bits $r_i$ of the dual graph for i as an integer ranging from 0 to 3.

Each input variable $x_i$ of the primal-dual graph and each output variable $r_i$ is therefore connected to the pair of constraints comprising an equality type constraint and a modulo-2 addition type constraint.

According to the example illustrated in FIG. 2C, we therefore obtain eight pairs of constraints framed in the figure, each connected to:
an input or output variable (of an information bit $x_i$ or redundancy type $r_i$ type); and
six internal variables (denoted for example as $v_1, v_2, v_3, v'_1, v'_2, v'_3$ for the pair of constraints 210, where the variables denoted as $v_k$ come from an equality type constraint and the variables denoted as $v_k$ come from a modulo-2 addition type constraint).

The four examples of constraints 210, 211, 212, 213 connected to the input variables $(x_0, x_1, x_2, x_3)$ are linked to the four pairs of constraints 220, 221, 222, 223 connected to the output variables $(r_0, r_1, r_2, r_3)$ by means of permutations or interleavers of 4×3=12 pairs of internal states of the encoder-decoder.

Each pair of constraints and its connections can be considered to be a tree in the theory of graphs, i.e. having no loop structure.

B) Second Example

Code (12, 6)

Here below, we present a second example of the building of a primal-dual graph according to the invention, obtained from the primal and dual graphs of the (12, 6) code.

The description here refers to a more general case where the switching matrix P is simply reversible/invertible.

Such a code implements a generating matrix G comprising, in its systematic form, an identity matrix and a matrix P for switching from source data to redundancy data which is invertible such that for example:

$$G = [Id | P] = \begin{bmatrix} 1 & 0 & 0 & 0 & 0 & 0 & 1 & 0 & 1 & 0 & 0 & 1 \\ 0 & 1 & 0 & 0 & 0 & 0 & 1 & 0 & 1 & 0 & 1 & 0 \\ 0 & 0 & 1 & 0 & 0 & 0 & 1 & 1 & 0 & 0 & 0 & 1 \\ 0 & 0 & 0 & 1 & 0 & 0 & 0 & 1 & 0 & 1 & 0 & 0 \\ 0 & 0 & 0 & 0 & 1 & 0 & 1 & 0 & 1 & 1 & 0 & 1 \\ 0 & 0 & 0 & 0 & 0 & 1 & 0 & 0 & 1 & 0 & 1 & 0 \end{bmatrix}$$

In this example we consider source data taking the form of six information bits denoted as $(x_0, x_1, x_2, x_3, x_4, x_5)$, and redundancy data taking the form of six redundancy bits denoted as $(r_0, r_1, r_2, r_3, r_4, r_5)$.

Figures 3A, 3B:
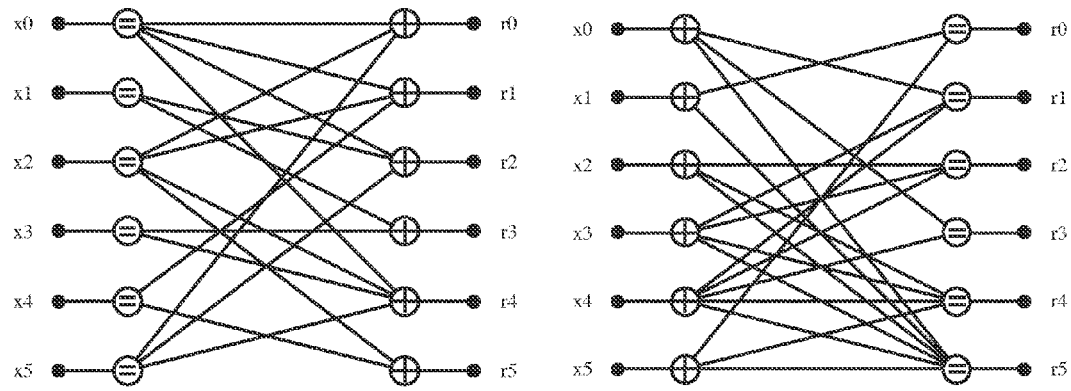

Classically, the algebraic relationships for computing redundancy bits from information bits can be represented by a Tanner graph corresponding to the primal (12, 6) code as illustrated in FIG. 3A.

As indicated in relation with the first example, such a primal graph comprises input variables corresponding to the information bits and output variables corresponding to the redundancy bits, the redundancy bits being linked to the information bits by means of constraints (equality or modulo-2 addition type constraints) and permutations.

In considering the switching matrix P to be invertible, it is possible to determine the matrix $P^{-1}$ of reverse switching and the Tanner graph corresponding to the dual of the (12, 6) code. FIG. 3B thus illustrates the dual graph obtained, comprising input variables, corresponding to the information bits, and output variables corresponding to the redundancy bits.

It can be noted that since the (12, 6) code is not self-dual, its switching matrix P is not equal to its own inverse and the primal and dual graphs obtained are not symmetrical. With regard to hardware resources, this example therefore uses two distinct interleavers.

According to the invention, and as described with reference to the first example, we define a modified Tanner graph, called a primal-dual graph, used to take account simultaneously of the primal code and of the dual code. To this end, the primal graph illustrated in FIG. 3A and dual graph illustrated in FIG. 3B, are superimposed to obtain a primal-dual graph illustrated in FIG. 3C.

This superimposition consists of the connection two-by-two of the input variables of the primal graph $(x_0, x_1, x_2, x_3,$ $x_4$, $x_5$) with the input variables of the dual graph ($x_0$, $x_1$, $x_2$, $x_3$, $x_4$, $x_5$) corresponding to the same source data and the two-by-two connection of the output variables ($r_0$, $r_1$, $r_2$, $r_3$, $r_4$, $r_5$) of the primal graph with the output variables ($r_0$, $r_1$, $r_2$, $r_3$, $r_4$, $r_5$) of the dual graph corresponding to the same redundancy data.

In other words, the information bits $x_i$ of the primal graph are linked to the information bits $x_i$ of the dual graph, for i as an integer ranging from 0 to 5, and the redundancy bits $r_i$ of the primal graph are linked to the redundancy bits $r_i$ of the dual graph, for i as an integer ranging from 0 to 5. Each input variable $x_i$ of the primal-dual graph and each output variable $r_i$ is therefore connected to a pair of constraints comprising an equality type constraint and a modulo-2 addition type constraint.

Figure 3C:
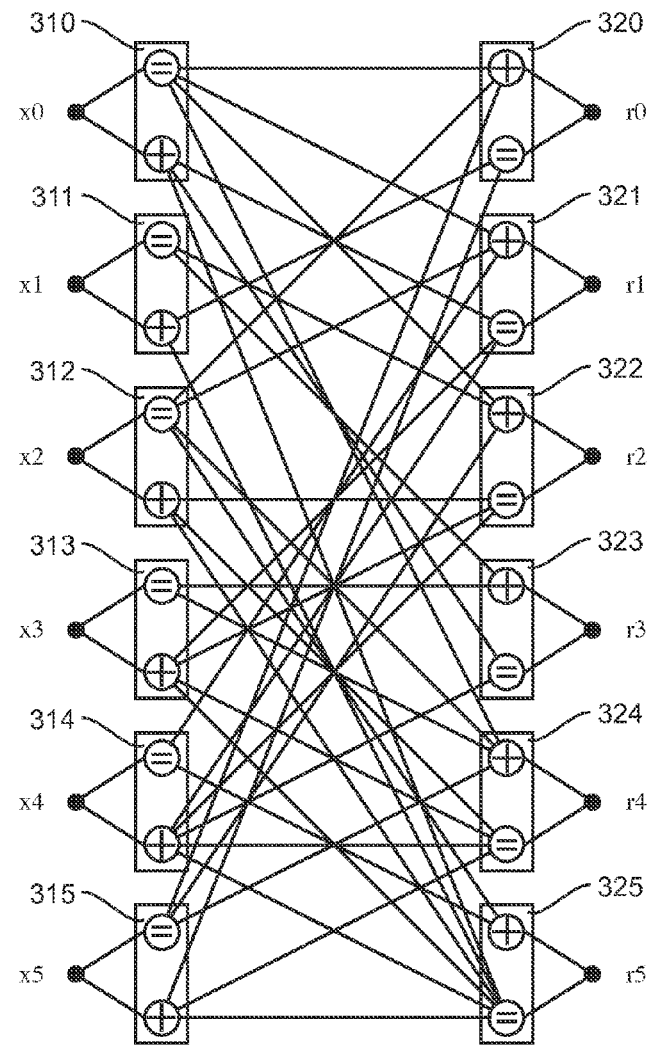

According to the example illustrated in FIG. 3C, we therefore obtain 12 pairs of constraints framed in the figure, each connected to:

an input or output variable (of an information bit $x_i$ type or redundancy bit $r_i$ type); and a set of internal variables.

The six pairs of constraints 310, 311, 312, 313, 314, 315 connected to the input variables ($x_0$, $x_1$, $x_2$, $x_3$, $x_4$, $x_5$) are linked to the six pairs of constraints 320, 321, 322, 323, 324, 325 connected to the output variables ($r_0$, $r_1$, $r_2$, $r_3$, $r_4$, $r_5$) by means of permutations or interleavers. Again, each pair of constraints and its connections can be considered to be a tree of the theory of graphs having no loop structure.

6.3 Determining Variables Connected to Equality or Modulo-2 Addition Type Constraints Here below, we describe the steps implemented for determining internal variables of a primal-dual graph associated with a pair of constraints according to one particular aspect of the invention. Naturally, other techniques and especially classic techniques can be used to determine these internal variables.

The input or output variables connected to a pair of constraints denoted as $v_i(0)$ at an initial instant t=0 are considered to be homogeneous with likelihood ratio logarithms, classically defined by:

$$v_i(0) = \log\left[\frac{proba(y_i|c_i = 1)}{proba(y_i|c_i = 0)}\right]$$

The internal variables are therefore also homogenoeus with likelihood ratio algorithms.

Figure 4:
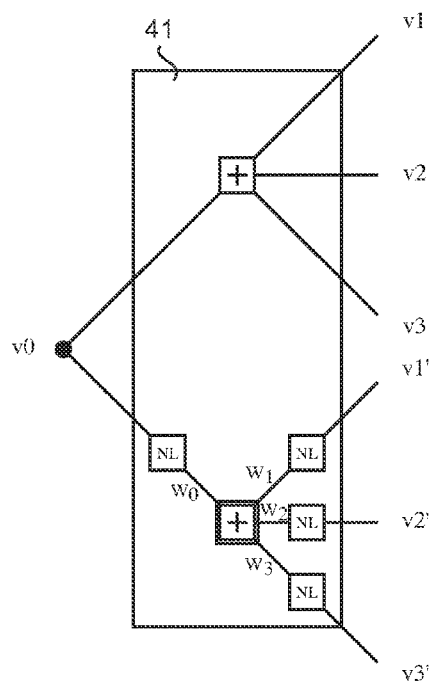
FIG. 4 is a detailed view of a pair of constraints according to the invention.

By way of an example, we also consider a pair of constraints of the primal-dual graph of the (8, 4, 4) Hamming code connected firstly to an input or output variable (of the information bit $x_i$ or redundancy bit $r_i$ type, more generally denoted as $v_i$) and secondly to six internal variables. Such an example of a pair of constraints is illustrated in FIG. 4.

To carry out the merging of the variables connected to an equality type constraint of a pair of constraints 41 (merging of the input variables or output variables at the initial instant and of the internal variables), it is possible to add, to the input or output variable at the initial instant, the average of the values of the internal variables connected to this constraint.

Thus, if we consider an input or output variable $v_0$ of the pair of constraints 41 at the initial instant t=0, the new value of this variable at the next instant t=1 (i.e. at the next iteration) can be expressed in the following form:

$$v_0(1) = v_0(0) + \frac{(v_1(0) + v_2(0) + v_3(0))}{3}.$$

An addition is therefore made in the real domain to determine the values of the variables connected to an equality type constraint.

To carry out the merging of the variables connected to a modulo-2 addition type constraint of a pair of constraints 41 (merging of the input or output variables at the initial instant and the internal variables), it is proposed according to one particular aspect of the invention to work in the complex field rather than in the real field in order to enable the use of a simple operation of addition.

Thus, according to this aspect of the invention, a non-linear function NL[x] is applied to all the variables connected to a modulo-2 addition type constraint before they can be added up in the complex domain.

More specifically, the function NL is added to the input or output variable $v_0$ of the pair of constraints 41 at the instant t=0, in the real domain to obtain an internal variable in the complex domain denoted as $w_0$, and the function NL is applied to the three internal variables $v'_1$, $v'_2$, $v'_3$ in the real field to obtain three internal variables $w_1$, $w_2$, $w_3$ in the complex domain.

The operation then passes into the real domain to obtain the new value of the variable $v_0$ at the following instant t=1. Thus, we obtain:

$$v_0(1) = NL\left[NL[v_0(0)] + \frac{(NL[v'_1(0)] + NL[v'_2(0)] + NL[v'_3(0)])}{3}\right] = NL\left[w_0 + \frac{(w_1 + w_2 + w_3)}{3}\right]$$

A transformation is therefore made, from the real domain to the complex domain, of the variables connected to the modulo-2 addition type of constraint, an addition is made in the complex domain, and then a transformation is made, from the complex domain to the real domain, of the result of the addition to determine the values of the variables connected to a modulo-2 addition type of constraint.

In particular, the non-linear function NL can be expressed in the following form:

$$\begin{cases} NL[x] = \log\left[\frac{1-\exp[x]}{1+\exp[x]}\right] & \text{if } x \neq 0 \\ NL[x] = 0 & \text{if } x = 0 \end{cases}.$$

Figure 5A:
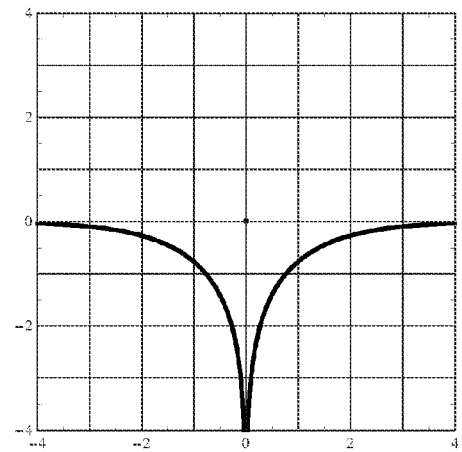
FIGS. 5A and 5B illustrate the function of non-linearity NL used to determine the internal variables of a primal-dual graph according to the invention.
Figure 5B:
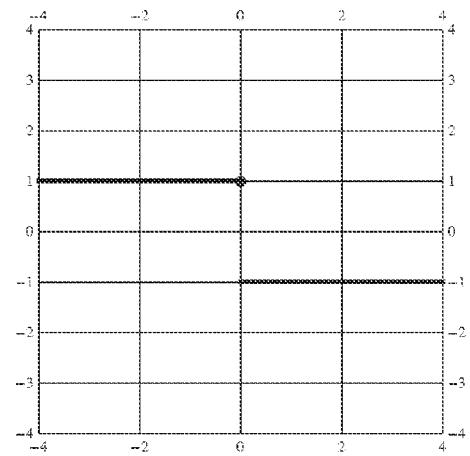

FIGS. 5A and 5B respectively illustrate the real part of the function NL ($\Re[NL[x]]$) and the variation of the sign of the imaginary part of the function NL ($e^{\Im[NL[x]]}$).

More specifically, given the field of variation of $x \in ]-\infty, +\infty[$, the result of the application of the non-linear function NL strictly has values in the field of the complex numbers $\mathbb{C}$, with an imaginary part capable of taking two values $\{0, +I\pi\}$, where is the pure imaginary number. In addition, for the purposes of initialization, the value NL[0]=0 is imposed.

To simplify the computations, it is then possible to consider this pure imaginary part as a sign and to simply multiply the result of the addition of the real parts by the product of the signs. This addition in the "dual domain" is therefore equivalent to an addition in the field of the complex numbers $\mathbb{C}$. This is particularly ingenious and innovative, especially for soft-decision decoders.

This non-linear function NL can be achieved with quantified numbers by a method of very little complexity using a programmable memory for example such as an EPROM (erasable programmable read-only memory), also called a LUT (look-up table).

Naturally, similar operations can be implemented to determine the values of the variables connected to an equality type constraint or to a modulo-2 addition type constraint in other contexts and especially to determine the values of variables not connected to a pair of constraints. Similarly, similar operations can be used whatever the number of internal variables connected to a constraint by adapting the above equations.

6.4 Propagation of the Variables

Here below, we present the different steps implemented to decode encoded data received by simultaneously using a primal error-correcting code and its dual.

To build such a decoder, we consider the primal-dual graphs as defined here above and especially the examples illustrated in FIGS. 2C and 3C.

More specifically, the decoding algorithm implements at least one decoding iteration, comprising:
- a phase of forward propagation in which the internal variables of the primal-dual graph which are connected to an equality type constraint are propagated to update the internal variables of the primal-dual graph which are connected to a modulo-2 addition type constraint, and
- a phase of backward propagation in which the internal variables of the primal-dual graph which are connected to a modulo-2 addition type constraint are propagated to update the internal variables of the primal-dual graph which are connected to an equality type constraint.

An iteration implements both forward and backward propagation phases for each pair of constraints (namely eight pairs for the (8, 4, 4) Hamming code, 12 pairs for the (12, 6) code, 24 pairs for a (24, 12, 8) Golay code, etc).

At initialization, the input variables, output variables and internal variables of the primal-dual graph are set at zero. Each tree then receives encoded data generally coming from a demodulator, this data corresponding either to source data (information bit) or to redundancy data (redundancy bit).

Here below, we describe the phases of forward and backward propagation implemented for each elementary tree associated with a pair of constraints during a same iteration.

$v_0(0)$ denotes the initial value assigned to an input variable or output variable of the primal-dual graph connected to a considered pair of constraints.

The forward propagation phase consists in propagating the likelihood values $v_i(t)$ of the primal domain to compute the likelihood values $v'_1(t+1)$ of the dual domain, where t is the discrete time index also corresponding to the order number of the iteration in progress.

More specifically, in a first step, a forward likelihood value $v_0^F(t)$ assigned to the input or output value connected to the constraint considered is determined, implementing an addition in the real domain, such that $$v_0^F(t) = \frac{\sum_{i=1}^{d} v_i(t)}{d},$$

with $i \in \{1, \ldots, d\}$, d the degree of constraints associated with the equality constraint of the pair of constraints considered and $v_i(t)$ are the internal variables connected to the equality constraint of the pair of constraints considered.

During a second step, the invention determines the values of likelihood assigned to the variables connected to the modulo-2 addition type constraint after transformation from the real domain to the complex domain, called transformed forward likelihood values, in applying the non-linearity function NL as described in detail in the paragraph above.

Thus, the input or output variable of the pair of constraints considered, after transformation, is expressed in the form $w_0^F(t)=NL[v_0(0)+v_0^F(t)]$ and $s_0^F(t)=\text{sign}[v_0(0)+v_0^F(t)]$, and the internal variables after transformation are expressed in the form $w_l^F(t)=NL[v'_l(t)]$ and $s_l^F(t)=\text{sign}[v'_l(t)]$, with $l \in \{1, \ldots, d\}$, d being the degree of constraint associated with the modulo-2 addition constraint of the pair of constraints considered, and $v'_l(t)$ being the internal variables connected to the modulo-2 addition constraint of the pair of constraints considered.

It can be noted that the values $w_l^F(t)$ correspond to the real parts of complex numbers whose imaginary parts can take the values $\{0, +I\pi\}$, but in taking the exponential of these values we obtain values with the sign $s_l^F(t) \in \{+1,-1\}$, which makes it possible to simplify the computation.

During a third step, the new values $w_l^F(t+1)$ and $s_l^F(t+1)$ are determined, in updating the transformed forward likelihood values, from an addition in the complex domain such that:

$$w_l^F(t+1) = w_0^F(t) + \frac{\sum_{i=1, i \neq l}^{d} w_i^F(t)}{d-1}$$

and $$s_l^F(t+1) = \prod_{i=0, i \neq l}^{d} s_i^F(t).$$

In a fourth step, the function of non-linearity NL is applied again in order to update the values of the internal variables connected to the modulo-2 addition type constraint $v'_l(t+1)$, from a transformation from the complex domain to the real domain of the updated transformed forward likelihood values, such that $v'_l(t+1)=s_l^F(t+1)NL[w_l^F(t+1)]$.

The backward propagation phase for its part consists in propagating the likelihood values $v'_l(t)$ from the dual domain to compute the likelihood of $v_l(t+1)$ of the primal domain.

More specifically, during a first step, the values of likelihood assigned to the variables connected to the modulo-2 addition type constraint of the pair of constraints considered is determined after transformation from the real domain to the complex domain (these values are called transformed backward likelihood values), by applying the function of non-linearity NL as described in detail in the paragraph here above.

The internal values after transformation are then expressed in the form: $w_l^B(t)=NL[v'_l(t)]$ and $s_l^B(t)=\text{sign}[v'_l(t)]$, for $l \in \{1, \ldots, d\}$, with d being the degree of constraint associated with a modulo-2 addition constraint of the pair of constraints considered.

The input or output variable of the pair of constraints considered after transformation is expressed for its part in the form:

$$w_0^B(t) = \frac{\sum_{l=1}^{d} w_l^B(t)}{d}$$

and $$s_0^B(t) = \left(\prod_{l=1}^{d} s_l^B(t)\right).$$

During a second step, a backward likelihood value $v_0^B(t)$ is determined. This value is assigned to the input or output variable of the pair of constraints considered, carrying out a transformation, from the complex domain to the real domain, of the input or output variable after transformation, in again applying the function of non-linearity NL $v_0^B(t) = s_0^{B(t)} \times NL[w_0^B(t)]$.

In a third step, the values $v_l(t+1)$ are determined, in updating the values of the internal variables connected to the equality type constraint, from an addition in the real domain such that:

$$v_l(t+1) = v_0(0) + v_0^B(t) + \frac{\sum_{i=1, i \neq l}^{d} v_i(t)}{d-1},$$

for $l \in \{1, \ldots, d\}$, with d being the degree of constraint associated with the equality constraint of the pair of constraints considered.

Finally, in a fourth step, the input or output variable of the pair of constraints considered is updated: $v_0(t+1) = v_0^F(t) + v_0(0) + v_0^B(t)$.

As already indicated, these two forward and backward propagation phases are implemented for each pair of constraints within a decoding iteration.

Several iterations of decoding can be implemented until a predefined number of iterations is reached or until there is a convergence of the internal variables for example.

More specifically, once the computations have been made for these pairs of constraints connected to an input value of the primal-dual graph (i.e. once the computations for the trees connected to the initial values of the information bits for the first iteration have been computed), the new pairs of primal and dual values $(v_l(t+1), v'_l(t+1))$ are transmitted to the pairs of constraints connected to an output variable of the primal-dual graph (i.e. to the trees connected to the initial values of the redundancy bits for the first iteration) during the forward propagation phase. This enables the performance of a new set of computations on these trees, in noting the inversion of side of the equality and modulo-2 addition type constraints. This amounts to permutating the dual and primal values such that $(v'_l(t+1), v_l(t+1))$ during the backward propagation phase.

The decoding algorithm proposed converges towards the closest code word of the word received very rapidly (within a few iterations) whatever the length of the code. For example, whereas according to the prior art, 20 to 50 iterations are sometimes needed to obtain a convergence of the algorithm for decoding an LDPC code, the invention enables a fast convergence within only a few iterations (of the order of five to six iterations for example).

Saturations at sufficiently great values such as ±4, limiting the possible values at output of the interval [−4,+4] therefore enable the algorithm to be made stable and robust. The algorithm converges towards these saturation values.

Again, it can be noted that it is possible to use the decoding technique described as a novel encoding technique, in forcing the redundancy bits to zero. Thus, if we consider a primal-dual graph defined according to the invention, comprising input variables corresponding to the source data and output variables corresponding to zero data, after implementing at least one iteration of the forward and backward propagation phases described here above, we obtain redundancy data at the output variables.

6.5 Structure of the Encoders and Decoders

Finally, referring to FIGS. 6A and 6B, we present the simplified structures of an encoder and decoder according to one particular embodiment of the invention.

The encoder comprises a memory 61 comprising a buffer memory, a processing unit 62, equipped for example with a microprocessor μP, and driven by the computer program 63, implementing the method of encoding according to one embodiment of the invention.

At initialization, the code instructions of the computer program 63 are for example loaded into a RAM and then executed by the processor of the processing unit 62. The processing unit 62 inputs a source data S and delivers encoded data comprising the source data and redundancy data. The microprocessor of the processing unit 62 implements the steps of the encoding method described here above according to the instructions of the computer program 63 to encode the source data. To this end, the encoder comprises, in addition to the buffer memory 61, an encoding module simultaneously implementing an error-correcting code and its dual code. This module is driven by the microprocessor of the processing unit 62.

The decoder comprises a memory 64 comprising a buffer memory, a processing unit 65 equipped for example with a microprocessor μP, and driven by the computer program 66, implementing the method of decoding according to an embodiment of the invention.

At initialization, the code instructions of the computer program 66 are for example loaded into a RAM and then executed by the processor of the processing unit 65. The processing unit 65 inputs encoded data comprising source data and redundancy data and delivers an estimation of the source data Ŝ. The microprocessor of the processing unit 65 implements the steps of the decoding method described here above according to the instructions of the computer program 66 to decode the encoded data. To this end, the decoder comprises, in addition to the buffer memory 64, a decoding module simultaneously implementing an error-correcting code and its dual code. This module is driven by the microprocessor of the processing unit 65.

Although the present disclosure has been described with reference to one or more examples, workers skilled in the art will recognize that changes may be made in form and detail without departing from the scope of the disclosure and/or the appended claims.

The invention claimed is:

1. A method for decoding encoded data, comprising source data and redundancy data, said redundancy data being obtained by the application to said source data, when encoding, of a primal error-correcting code which can be represented by a generating matrix comprising, in its systematic form, an identity matrix and an invertible matrix for switching from source data to redundancy data, wherein said method comprises:

receiving, by a decoding device, a packet or a stream comprising the encoded data from a wired or wireless transmission channel, the encoded data being susceptible to transmission errors in the transmission channel;

decoding the encoded data by the decoding device to generate an estimate of corrected source data, wherein decoding comprises:

the decoding device implementing a primal-dual error correcting code in an integrated circuit or in a microprocessor electronic component executing instructions, the primal-dual error correcting code simultaneously implementing said primal error-correcting code and a dual error correcting code that is the dual of the primal error-correcting code, wherein the primal-dual error correcting code is configured to represent a modified Tanner graph, called a primal-dual Tanner graph, that is a superposition of a primal Tanner graph corresponding to the primal error-correcting code and a dual Tanner graph corresponding to the dual error-correcting code, said superimposition comprising a two-by-two connection of input variables of said primal Tanner graph with input variables of said dual Tanner graph corresponding to the same source data and a two-by-two connection of output variables of the primal Tanner graph with output variables of said dual Tanner graph corresponding to the same redundancy data, the input and output variables of the primal-dual Tanner graph corresponding to input and output variables of the primal-dual error correcting code;

the decoding device applying the source data and the redundancy data of the received encoded data that is susceptible to transmission errors to the input variables and the output variables, respectively, of the primal-dual error-correcting code;

the decoding device processing the input variables and output variables according to the primal-dual error correcting code to produce the estimate of the corrected source data.

2. The method for decoding according to claim 1, wherein each input or output variable of the primal-dual Tanner graph is connected to a pair of constraints comprising an equality type constraint and a modulo-2 addition type constraint, and said processing the input and output variables comprises the decoding device determining at least one internal variable of the primal-dual Tanner graph, which comprises implementing:

for a modulo-2 addition type of constraint:
a step of transformation, from the real domain to the complex domain, of the variables connected to the modulo-2 addition type constraint;
a step of addition in the complex domain;
a step of transformation, from the complex domain to the real domain, of the result of the addition step;

for an equality type constraint:
a step of addition in the real domain.

3. The method for decoding according to claim 2, wherein said steps of transformation apply a non-linear function NL such that:

$$\begin{cases} NL[x] = \log\left[\dfrac{1-\exp[x]}{1+\exp[x]}\right] & \text{if } x \neq 0 \\ NL[x] = 0 & \text{if } x = 0 \end{cases}.$$

4. The method for decoding according to claim 1, wherein each input or output variable of the primal-dual Tanner graph is connected to a pair of constraints comprising an equality type constraint and a modulo-2 addition type constraint, and the processing the input and output variables comprises the decoding device implementing at least one decoding iteration, comprising:

a forward propagation phase comprising propagation of internal variables of the primal-dual Tanner graph which are connected to an equality type constraint, to update internal variables of the primal-dual Tanner graph which are connected to a modulo-2 addition type constraint, and a backward propagation phase comprising propagation of internal variables of the primal-dual Tanner graph which are connected to a modulo-2 addition type constraint, to update internal variables of the primal-dual Tanner graph which connected to an equality type constraint.

5. The method for decoding according to claim 4, wherein said forward propagation phase implements the following sub-steps for each pair of constraints connected to an input or output variable of the primal-dual Tanner graph:

determining a forward likelihood value $v_0^F(t)$ assigned to the input or output variable of the primal-dual Tanner graph, implementing an addition in the real domain, such that:

$$v_0^F(t) = \frac{\sum_{i=1}^{d} v_i(t)}{d},$$

determining likelihood values assigned to the variables connected to the modulo-2 addition type of constraint after transformation from the real domain to the complex domain, called transformed forward likelihood values, such that:

the input or output variable of the primal-dual Tanner graph after transformation is expressed in the form: $w_0^F(t)=NL[v_0(0)+v_0^F(t)]$ and $s_0^F(t)=\text{sign}[v_0(0)+v_0^F(t)]$;

the internal variables after transformation are expressed in the form: $w_l^F(t)=NL[v'_l(t)]$ and $s_l^F(t)=\text{sign}[v'_l(t)]$ for $l\in\{1,\ldots,d\}$;

updating the transformed forward likelihood values, implementing an addition in the complex domain, such that:

$$w_l^F(t+1) = w_0^F(t) + \frac{\sum_{i=1,i\neq l}^{d} w_i^F(t)}{d-1}$$

and $$s_l^F(t+1) = \prod_{i=0,i\neq l}^{d} s_i^F(t)$$

updating the values of the internal variables connected to the modulo-2 addition type constraint implementing a transformation, from the complex domain to the real domain of the updated transformed forward likelihood values such that:

$v'_l(t+1)=s_l^F(t+1)NL[w_l^F(t+1)]$;

with:
$v_0(0)$ being an initial value assigned to said input or output variable of the primal-dual Tanner graph;
$v_i(t)$ being the internal variables connected to the equality type constraint;

$v'_l(t)$ being the internal variables connected to the modulo-2 addition type constraint;

d being the degree of constraints associated with a constraint of the primal-dual graph;

$i \in \{1, \ldots, d\} l \in \{1, \ldots, d\}$;

NL[x] being a non-linear function such that:

$$\begin{cases} NL[x] = \log\left[\dfrac{1 - \exp[x]}{1 + \exp[x]}\right] & \text{if } x \neq 0 \\ NL[x] = 0 & \text{if } x = 0 \end{cases}.$$

6. The method for decoding according to claim 4, wherein said backward propagation phase implements the following sub-steps, for each pair of constraints connected to an input or output variable of the primal-dual Tanner graph:

determining likelihood values assigned to the variables connected to the modulo-2 addition type constraint after transformation from the real domain to the complex domain, called transformed backward likelihood values, such that:

the internal variables after transformation are expressed in the form: $w_l^B(t) = NL[v'_l(t)]$ and $s_l^B(t) = \text{sign}[v'_l(t)]$ for $l \in \{1, \ldots, d\}$;

the input or output variable of the primal-dual Tanner graph after transformation is expressed in the form:

$$w_0^B(t) = \dfrac{\sum_{l=1}^{d} w_l^B(t)}{d}$$

and $$s_0^B(t) = \left(\prod_{l=1}^{d} s_l^B(t)\right);$$

determining a backward likelihood value $v_0^B(t)$ assigned to the input or output variable of the primal-dual Tanner graph, implementing a transformation from the complex domain to the real domain of the input or output variable after transformation such that:

$v_0^B(t) = s_0^B(t) \times NL[w_0^B(t)]$ updating the values of the internal variables connected to the equality type constraint implementing an addition in the real domain, such that:

$$v_l(t+1) = v_0(0) + v_0^B(t) + \dfrac{\sum_{i=1, i \neq l}^{d} v_i(t)}{d - 1},$$

updating the input or output variable of the primal-dual Tanner graph such that:

$v_0(t+1) = v_0^F(t) + v_0(0) + v_0^B(t)$ with:

$v_0(0)$ being an initial value assigned to the input or output variable of the primal-dual Tanner graph;

$v_i(t)$ being the internal variables connected to the equality type constraint;

$v'_l(t)$ being the internal variables connected to the modulo-2 addition type constraint;

d being the degree of constraints associated with a constraint of the primal-dual Tanner graph;

$i \in \{1, \ldots, d\}, l \in \{1, \ldots, d\}$;

NL[x] being a non-linear function such that:

$$\begin{cases} NL[x] = \log\left[\dfrac{1 - \exp[x]}{1 + \exp[x]}\right] & \text{if } x \neq 0 \\ NL[x] = 0 & \text{if } x = 0 \end{cases}.$$

7. The method for decoding according to claim 4, wherein the method comprises a preliminary step of initializing the input variables, the output variables and the internal variables of the primal-dual Tanner graph at zero.

8. The method for decoding according to claim 1, wherein at least two input or output variables of the primal-dual Tanner graph are connected to a same pair of constraints comprising an equality type constraint and a modulo-2 addition type constraint.

9. A device for decoding encoded data, comprising source data and redundancy data, said redundancy data being obtained by the application to said source data, when encoding, of a primal error-correcting code which can be represented by a generating matrix comprising, in its systematic form, an identity matrix and an invertible matrix for switching from the source data to the redundancy data, wherein said device comprises:

an input receiving a packet or a stream comprising the encoded data from a wired or wireless transmission channel, the encoded data being susceptible to transmission errors in the transmission channel;

a processing unit comprising an integrated circuit or a microprocessor electronic component executing configured by instructions stored in a non-transitory computer-readable medium, the processing unit being configured to:

implement a primal-dual error correcting code, the primal-dual error correcting code simultaneously implementing said primal error-correcting code and a dual error correcting code that is the dual of the primal error-correcting code, wherein the primal-dual error correcting code is configured to represent a modified Tanner graph, called a primal-dual Tanner graph, that is a superposition of a primal Tanner graph corresponding to the primal error-correcting code and a dual Tanner graph corresponding to the dual error-correcting code, said superimposition comprising a two-by-two connection of input variables of said primal Tanner graph with input variables of said dual Tanner graph corresponding to the same source data and a two-by-two connection of output variables of the primal Tanner graph with output variables of said dual Tanner graph corresponding to the same redundancy data, the input and output variables of the primal-dual Tanner graph corresponding to input and output variables of the primal-dual error correcting code;

apply the source data and the redundancy data of the received encoded data that is susceptible to transmission errors to the input variables and the output variables, respectively, of the primal-dual error-correcting code; and process the input variables and output variables according to the primal-dual error correcting code to produce an estimate of corrected source data; and an output supplying the estimate of the corrected source data.

* * * * *